(12) United States Patent
Nagata et al.

(10) Patent No.: US 10,943,854 B2
(45) Date of Patent: Mar. 9, 2021

(54) SEMICONDUCTOR PACKAGE AND SEMICONDUCTOR APPARATUS FOR USE WITH HIGH-FREQUENCY SIGNALS AND IMPROVED HEAT DISSIPATION

(71) Applicant: KYOCERA Corporation, Kyoto (JP)

(72) Inventors: Michikazu Nagata, Higashiomi (JP); Shoujirou Kizu, Omi-Hachiman (JP); Shinya Tomida, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/463,565

(22) PCT Filed: Oct. 12, 2017

(86) PCT No.: PCT/JP2017/036965
§ 371 (c)(1),
(2) Date: May 23, 2019

(87) PCT Pub. No.: WO2018/096826
PCT Pub. Date: May 31, 2018

(65) Prior Publication Data
US 2019/0279923 A1    Sep. 12, 2019

(30) Foreign Application Priority Data

Nov. 28, 2016 (JP) .............................. JP2016-230125

(51) Int. Cl.
*H01L 23/495* (2006.01)
*H01L 23/36* (2006.01)
*H01L 23/12* (2006.01)
(Continued)

(52) U.S. Cl.
CPC ........ *H01L 23/49537* (2013.01); *H01L 23/12* (2013.01); *H01L 23/13* (2013.01);
(Continued)

(58) Field of Classification Search
CPC ..... H01L 23/12; H01L 23/13; H01L 23/3107; H01L 23/49537; H01L 23/49568; H01L 23/04; H01L 23/047; H01L 23/52
See application file for complete search history.

(56) References Cited

U.S. PATENT DOCUMENTS 4,677,528 A * 6/1987 Miniet ................ H01L 23/5387
235/488
4,763,188 A * 8/1988 Johnson .............. H01L 23/3107
174/529
(Continued)

FOREIGN PATENT DOCUMENTS

| JP | 04-322452 A | 11/1992 |
| JP | 2012-231101 A | 11/2012 |
| WO | 2014/017273 A1 | 1/2014 |

OTHER PUBLICATIONS

Kyocera Corporation., English translated of WO2014/017273, Publisher Jan. 30, 2014; (Machine translated May 18, 2020).*

*Primary Examiner* — Mohsen Ahmadi
(74) *Attorney, Agent, or Firm* — Volpe Koenig (57) ABSTRACT

A semiconductor package includes a metal board, a first frame, and a second frame. The metal board has an upper surface with a mount area on which a semiconductor device is mountable. The first frame is located on the upper surface of the metal board to surround the mount area. The second frame is located on a bottom surface of the metal board to overlap the first frame. The metal board includes a protrusion protruding from its bottom surface. The protrusion has side surfaces in contact with inner walls of the second frame. The protrusion has a bottom surface located below the second frame.

9 Claims, 11 Drawing Sheets

(51) Int. Cl.
   *H01L 23/13* (2006.01)
   *H01L 23/373* (2006.01)
   *H01L 23/00* (2006.01)
   H01L 23/04 (2006.01)
   H01L 23/047 (2006.01)
   H01L 23/52 (2006.01)

(52) U.S. Cl.
   CPC ........ *H01L 23/36* (2013.01); *H01L 23/49568* (2013.01); *H01L 23/49582* (2013.01); *H01L 23/04* (2013.01); *H01L 23/047* (2013.01); *H01L 23/52* (2013.01); *H01L 2224/48091* (2013.01)

(56) References Cited

U.S. PATENT DOCUMENTS

| | | | | |
|---|---|---|---|---|
| 4,908,933 A | * | 3/1990 | Sagisaka | H01L 21/67144 |
| | | | | 174/262 |
| 7,605,475 B2 | * | 10/2009 | Ochiai | H01L 24/73 |
| | | | | 257/774 |
| 7,944,043 B1 | * | 5/2011 | Chung | H01L 21/568 |
| | | | | 257/698 |
| 7,977,698 B2 | * | 7/2011 | Ling | G09F 9/33 |
| | | | | 257/100 |
| 8,994,157 B1 | * | 3/2015 | Kiew | H01L 21/4832 |
| | | | | 257/666 |
| 9,209,114 B2 | * | 12/2015 | Yoo | H01L 21/50 |
| 2012/0161309 A1 | | 6/2012 | Utsumi | |
| 2014/0197528 A1 | * | 7/2014 | Nagata | H01L 23/04 |
| | | | | 257/680 |
| 2014/0291720 A1 | * | 10/2014 | Lo | H01L 33/486 |
| | | | | 257/99 |
| 2015/0334877 A1 | | 11/2015 | Kawagoe et al. | |
| 2016/0268237 A1 | * | 9/2016 | Lee | H01L 33/62 |
| 2016/0276175 A1 | * | 9/2016 | Kotokawa | H01L 24/48 |
| 2018/0019386 A1 | * | 1/2018 | Lee | H01L 33/647 |
| 2019/0109070 A1 | * | 4/2019 | Ho | H01L 23/14 |

* cited by examiner

SEMICONDUCTOR PACKAGE AND SEMICONDUCTOR APPARATUS FOR USE WITH HIGH-FREQUENCY SIGNALS AND IMPROVED HEAT DISSIPATION

FIELD

The present invention relates to a semiconductor package in which a semiconductor device is mountable, and a semiconductor apparatus including the semiconductor package.

BACKGROUND

A known semiconductor package contains, for example, a semiconductor device that operates with high-frequency signals. Such a semiconductor device generates heat during operation. To release heat outside, a semiconductor package may include a metal mounting board with improved heat dissipation on which a semiconductor device is mountable (refer to Japanese Patent Application Publication No. 2012-231101).

A semiconductor package described in Japanese Patent Application Publication No. 2012-231101 includes a metal board, a first frame, and a second frame. The metal board has a protrusion with side surfaces joined to the inner walls of the second frame.

However, in the package described in Patent Literature 1, the metal board has a bottom surface located at the same level as or above the bottom surface of the second frame. This structure may fail to release heat generated in the semiconductor device efficiently outside.

BRIEF SUMMARY

A semiconductor package according to one aspect of the present invention includes a metal board, a first frame, and a second frame. The metal board has an upper surface with a mount area on which a semiconductor device is mountable. The first frame is located on the upper surface of the metal board to surround the mount area. The second frame is located on a bottom surface of the metal board to overlap the first frame. The metal board includes a protrusion protruding from its bottom surface. The protrusion has side surfaces in contact with inner walls of the second frame. The protrusion has a bottom surface located below the second frame.

A semiconductor apparatus according to another aspect of the present invention includes the semiconductor package according to the above aspect, a semiconductor device, and a lid. The semiconductor device is mounted on the mount area. The lid is joined to the upper surface of the first frame and covers the semiconductor device.

DETAILED DESCRIPTION

The semiconductor package according to one or more embodiments and a semiconductor apparatus including the semiconductor package will now be described with reference to the drawings.

Structure of Semiconductor Package

Figure 1:
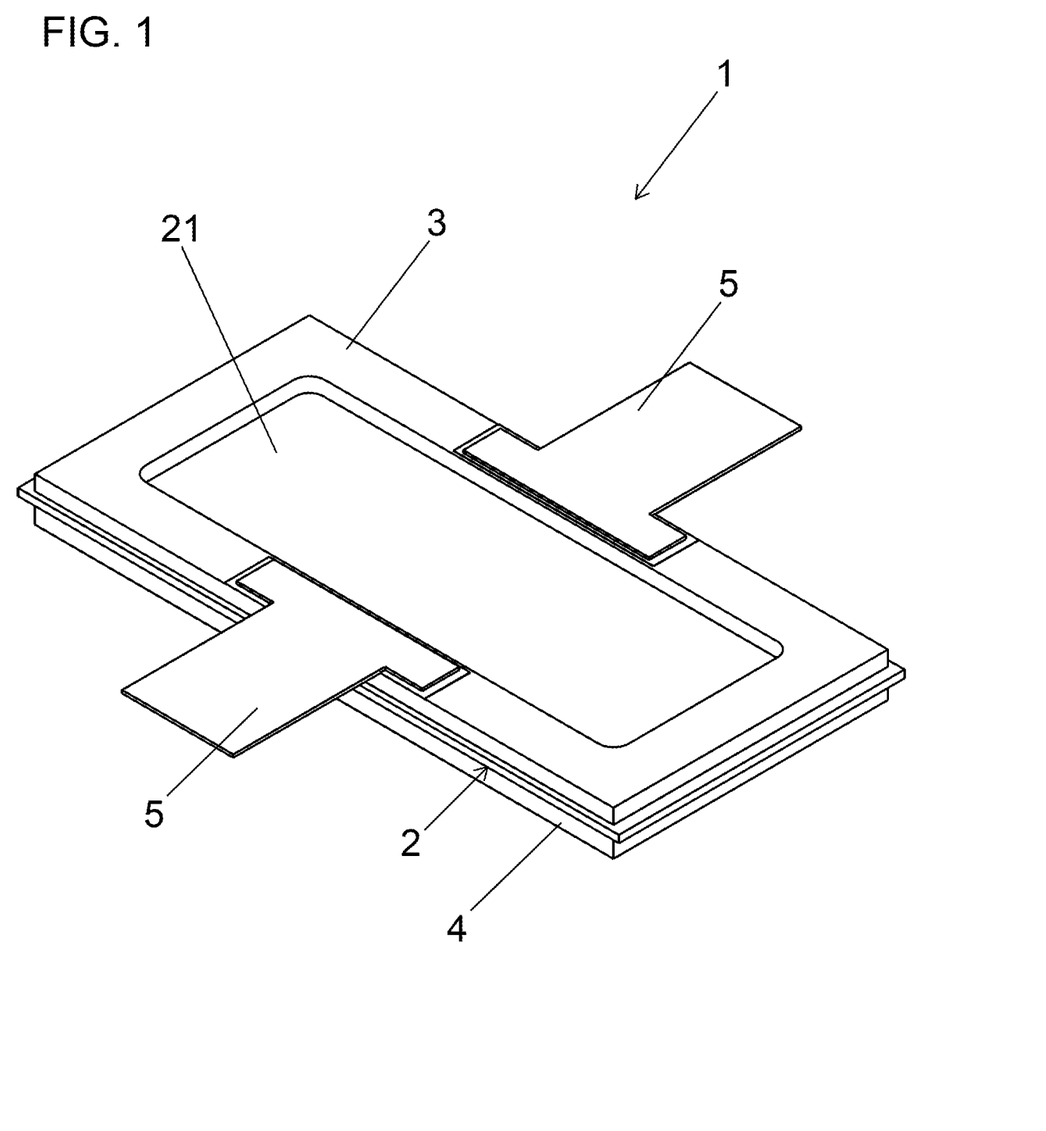
FIG. 1 is a top perspective view of a semiconductor package according to an embodiment of the present invention.
Figure 2:
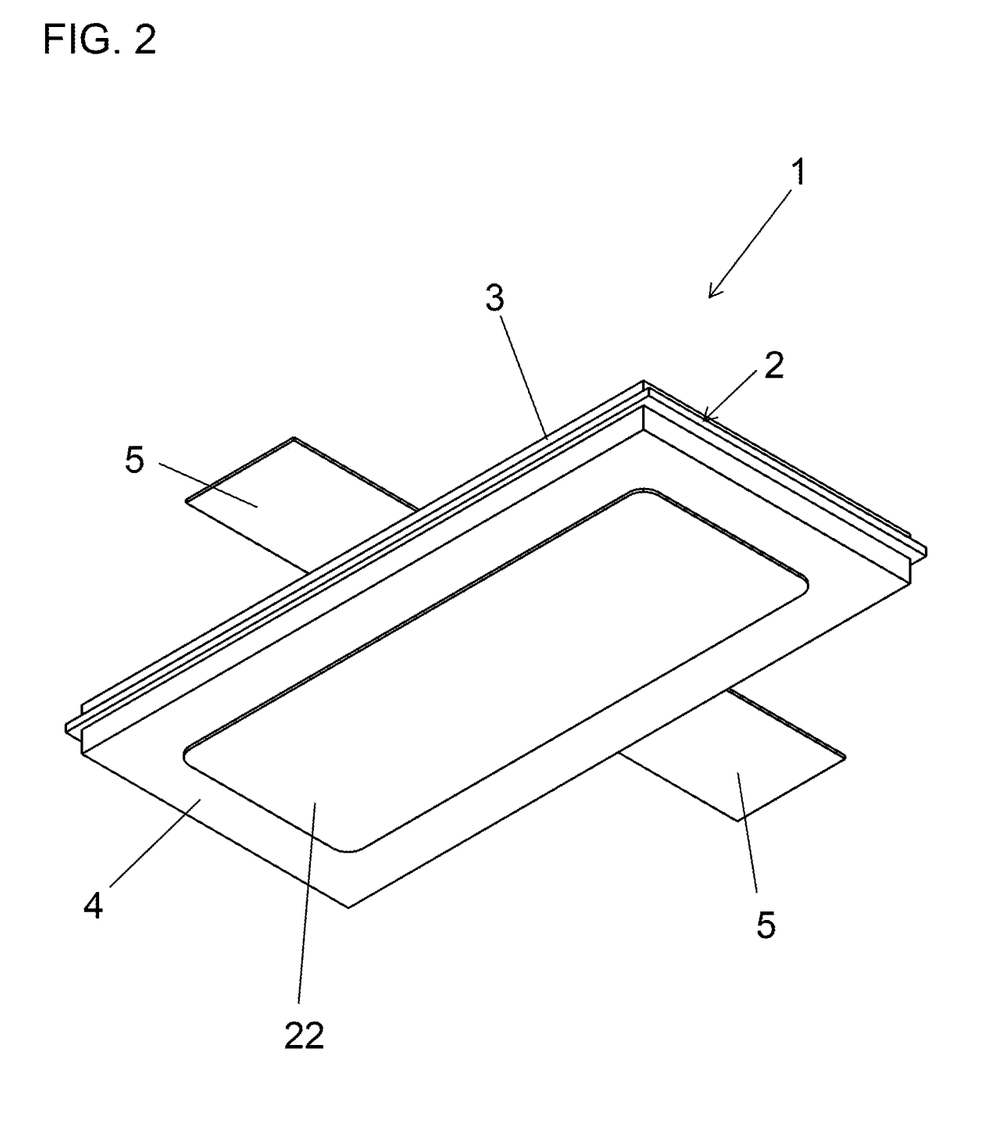
FIG. 2 is a bottom perspective view of the semiconductor package according to the embodiment of the present invention.
Figure 3:
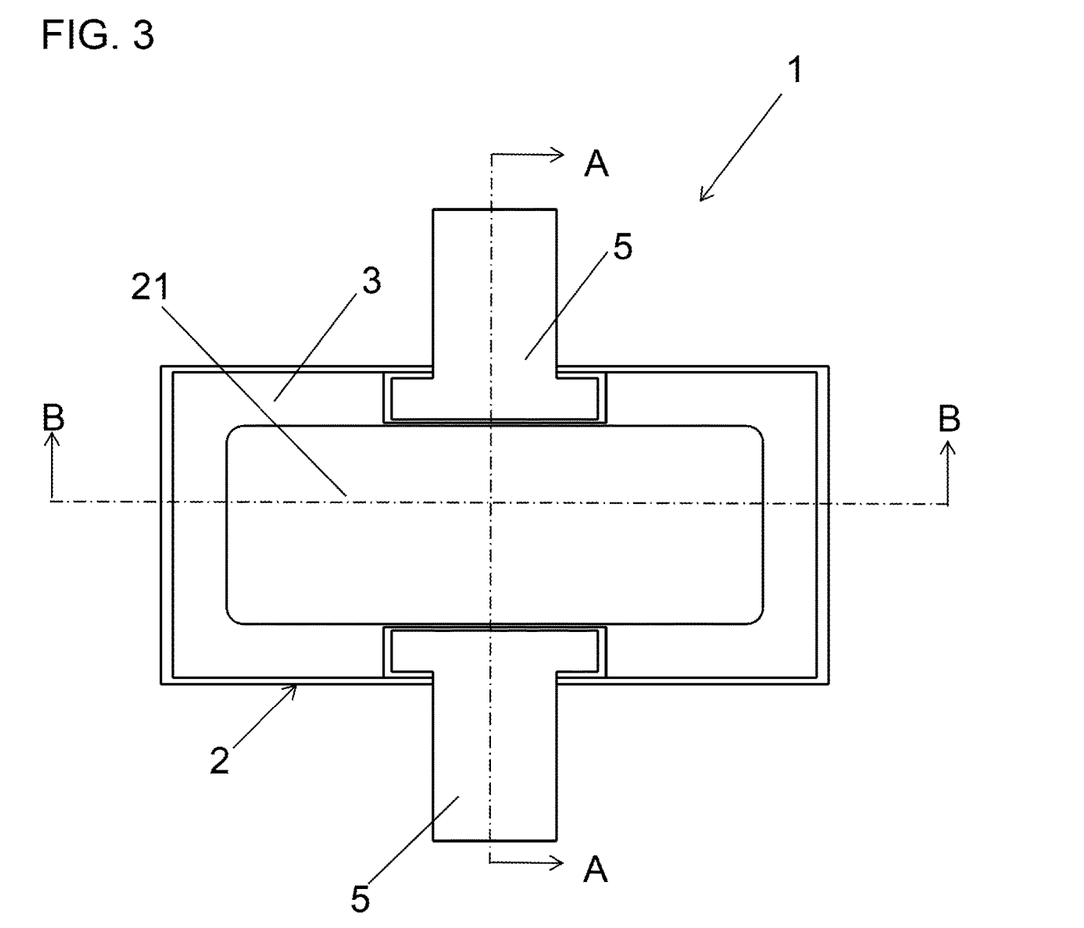
FIG. 3 is a top plan view of the semiconductor package according to the embodiment of the present invention.
Figure 4:
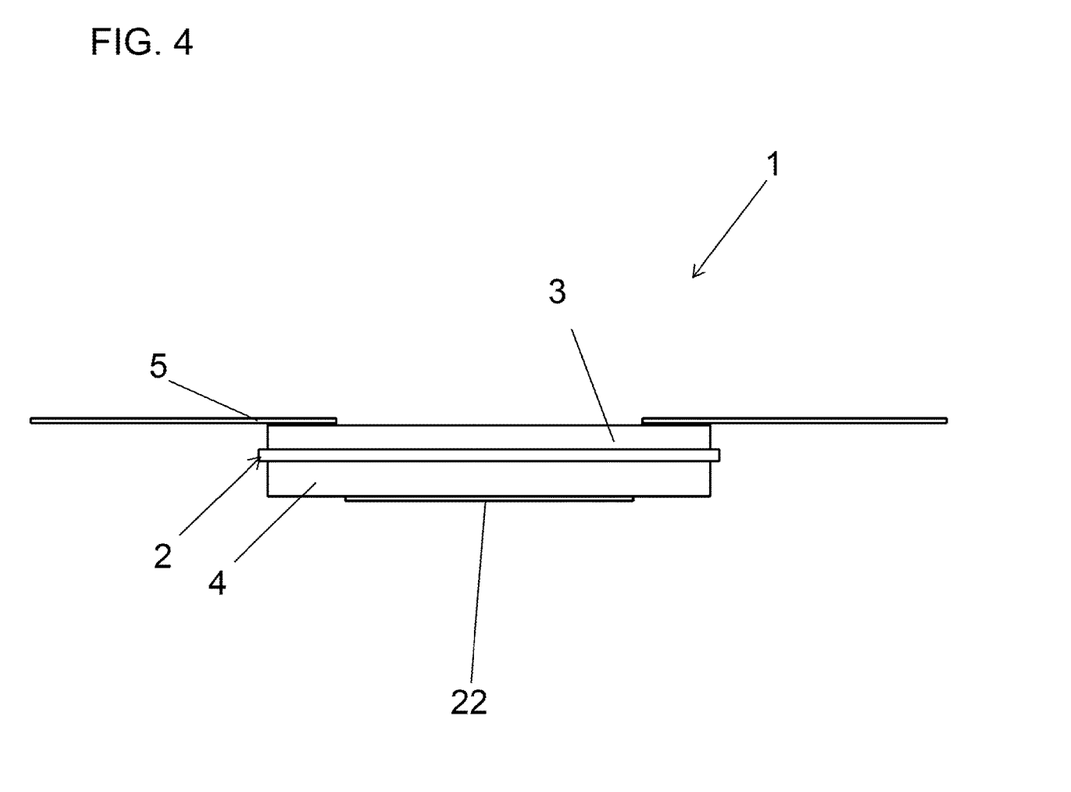
FIG. 4 is a side view of the semiconductor package according to the embodiment of the present invention.
Figure 5:
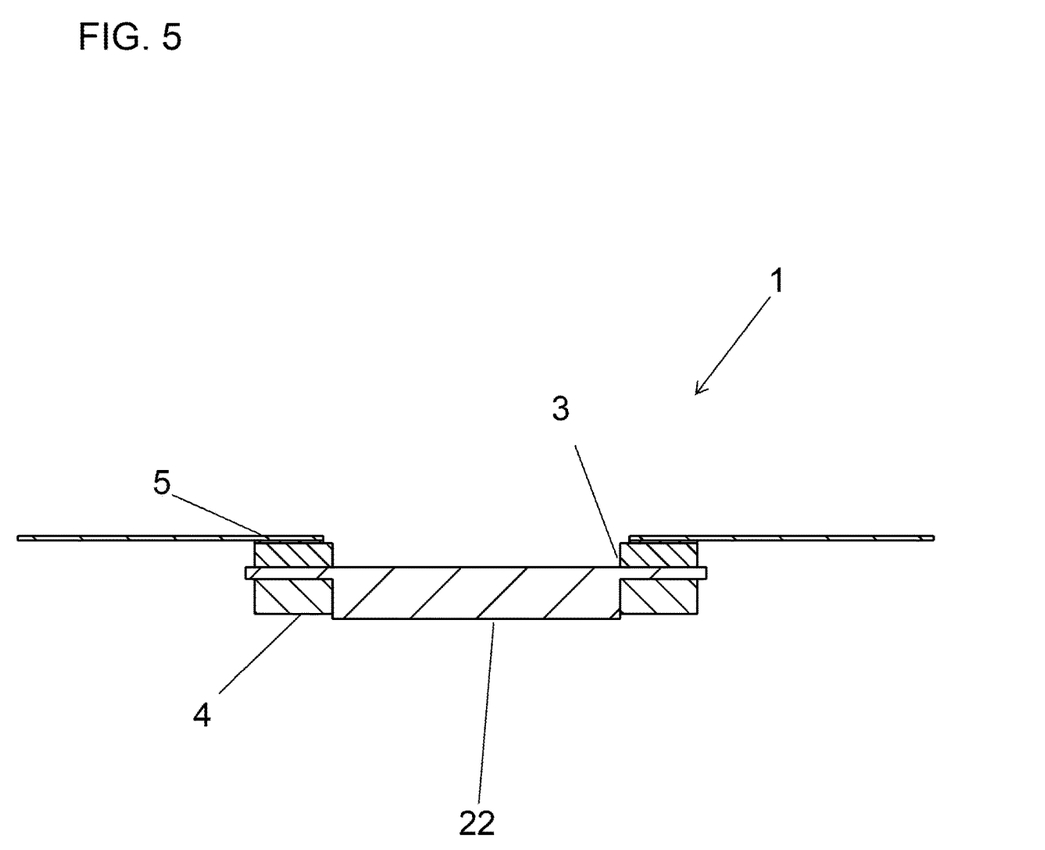
FIG. 5 is a cross-sectional view of the semiconductor package according to the embodiment of the present invention taken along line A-A in FIG. 3.
Figure 6:
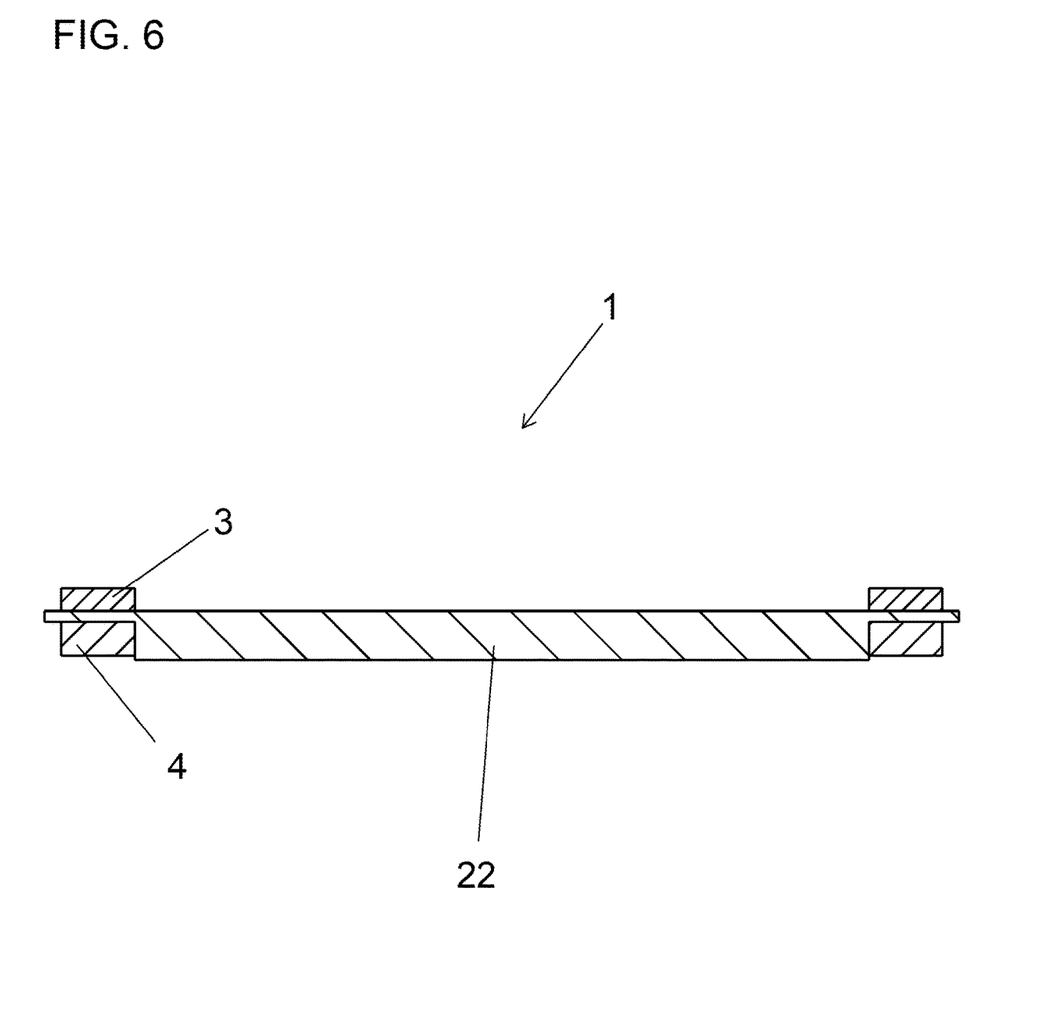
FIG. 6 is a cross-sectional view of the semiconductor package according to the embodiment of the present invention taken along line B-B in FIG. 3.
Figure 7:
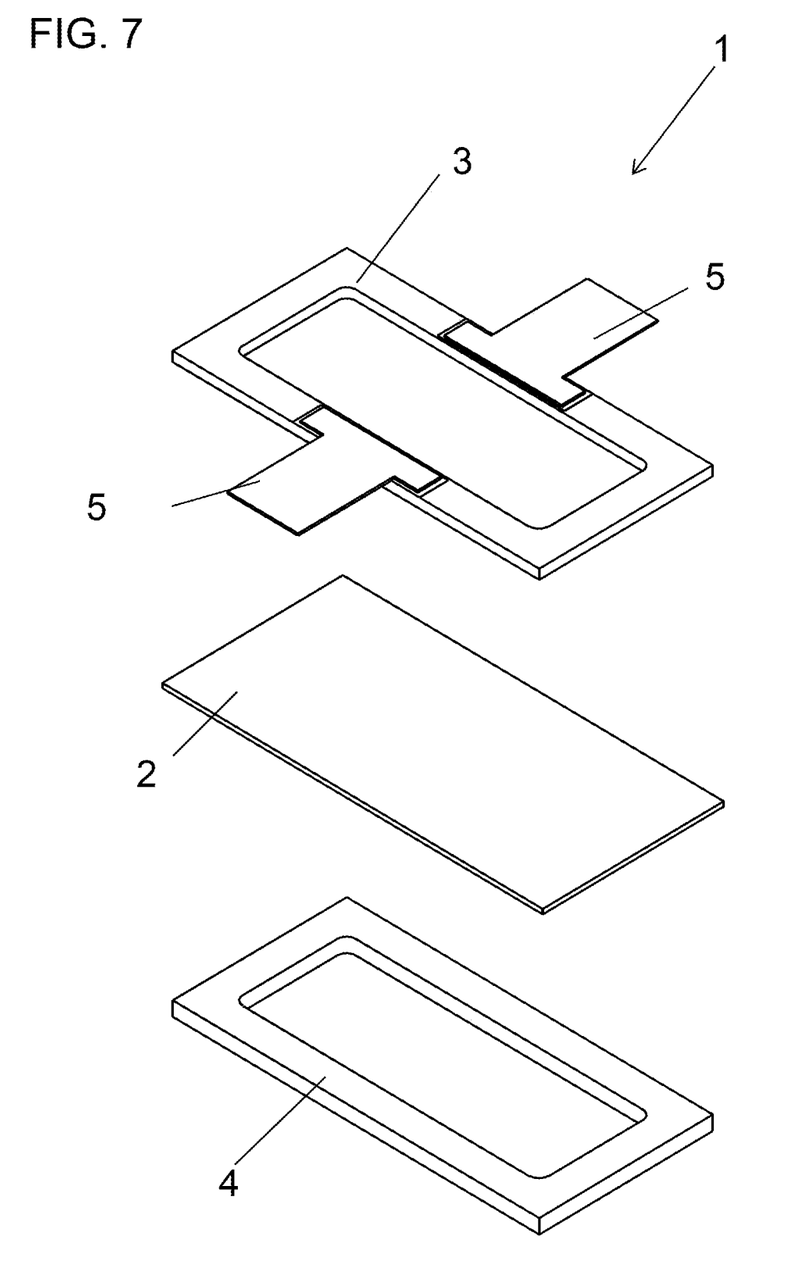
FIG. 7 is an exploded top perspective view of the semiconductor package according to the embodiment of the present invention.
Figure 8:
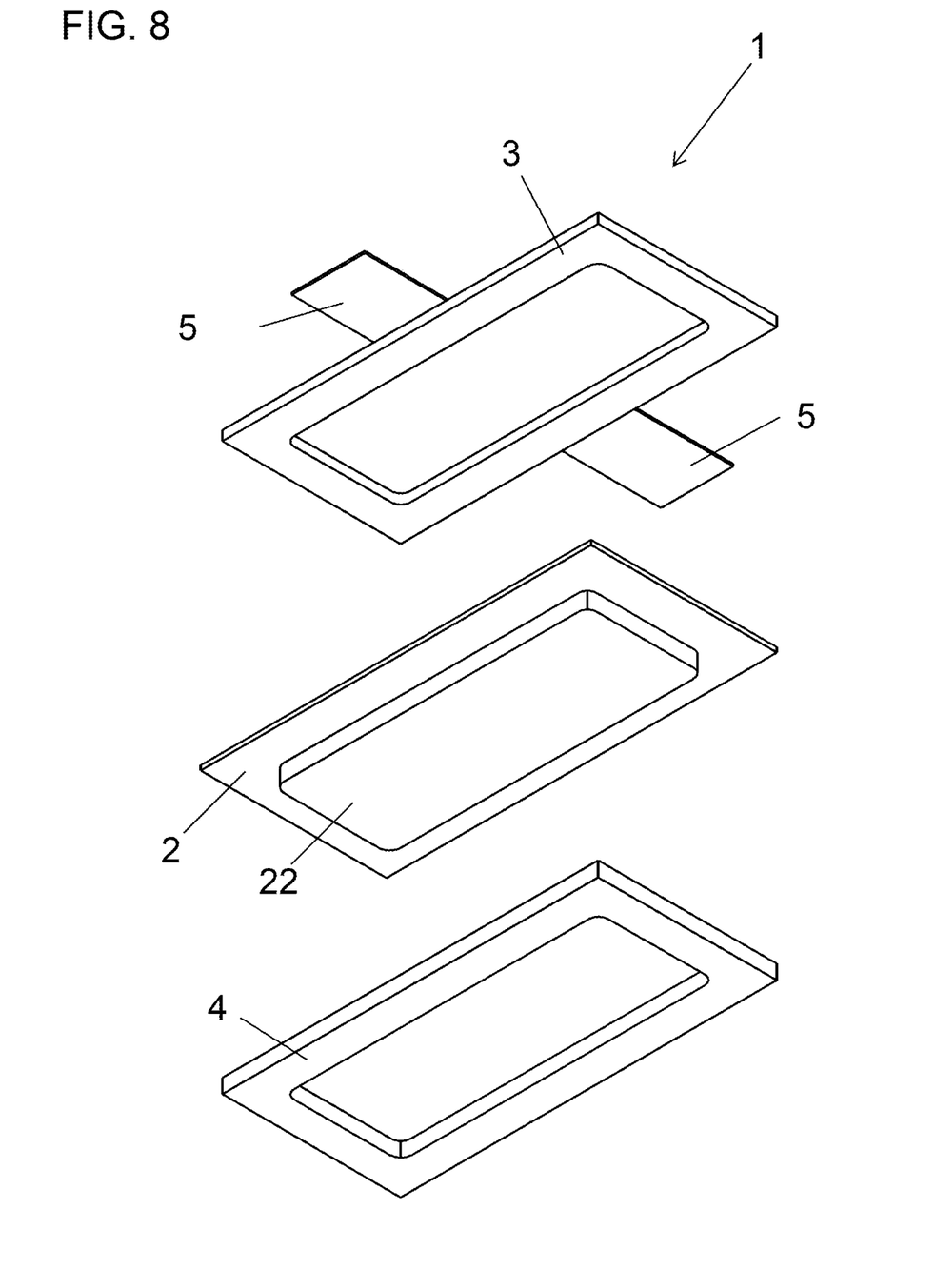
FIG. 8 is an exploded bottom perspective view of the semiconductor package according to the embodiment of the present invention.
Figure 9:
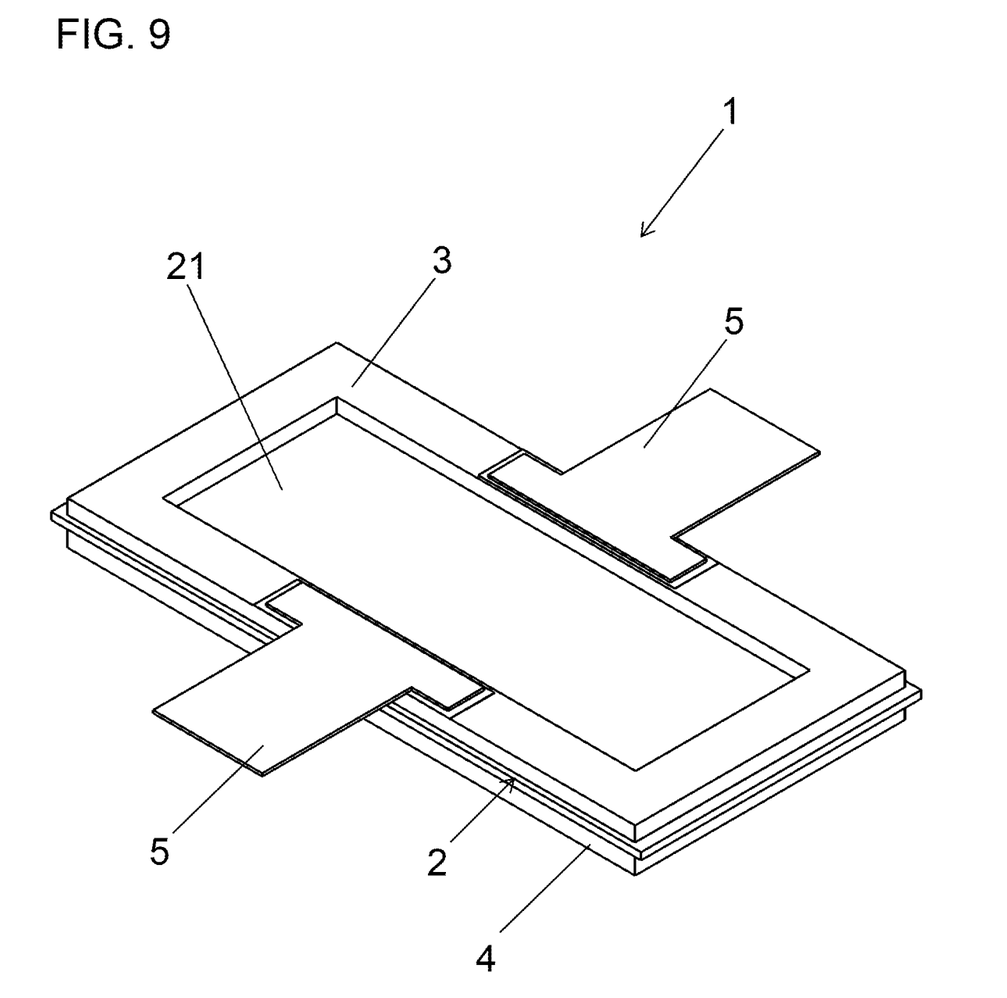
FIG. 9 is a top perspective view of a semiconductor package according to another embodiment of the present invention.
Figure 10:
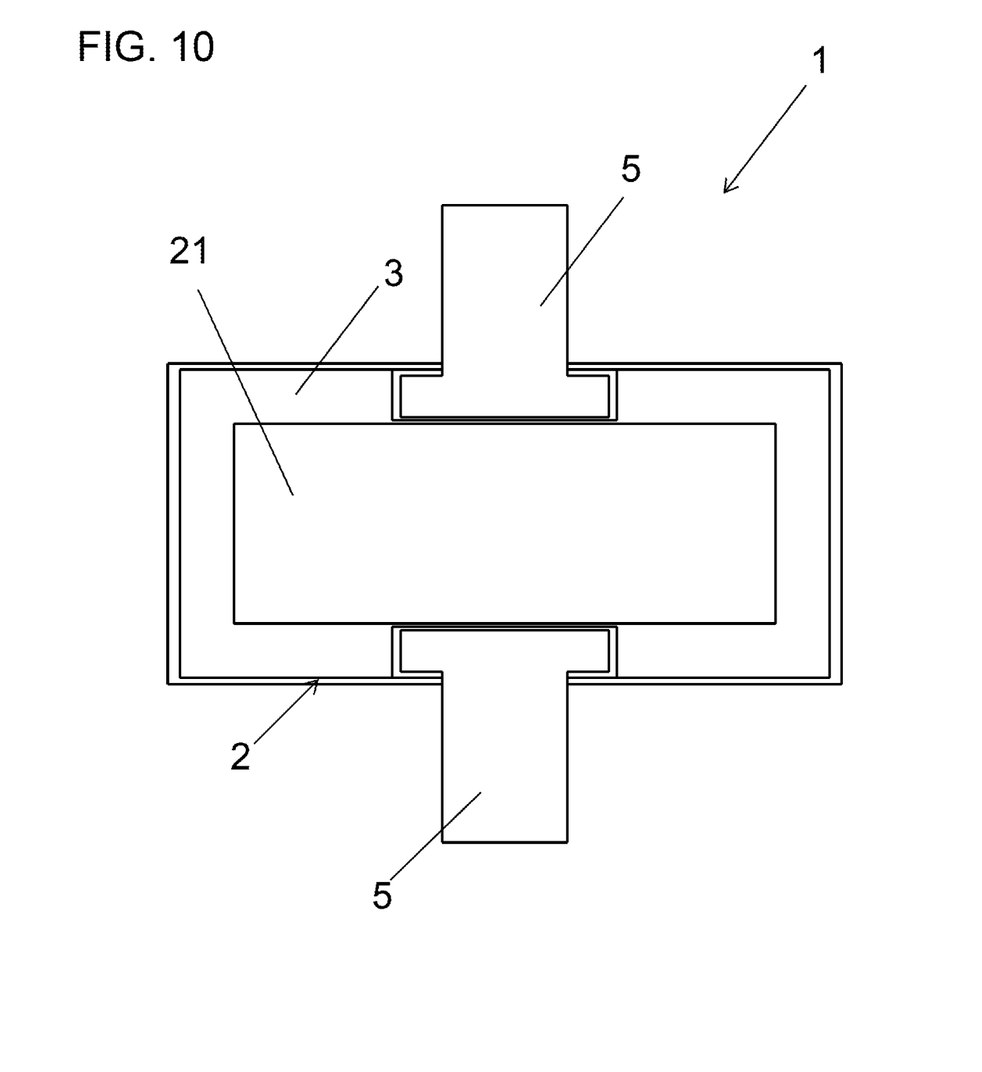
FIG. 10 is a top plan view of the semiconductor package according to the other embodiment of the present invention.

FIG. 1 is a top perspective view of a semiconductor package according to an embodiment of the present invention. FIG. 2 is a bottom perspective view of the semiconductor package according to the embodiment of the present invention. FIG. 3 is a top plan view of the semiconductor package according to the embodiment of the present invention. FIG. 4 is a side view of the semiconductor package according to the embodiment of the present invention. FIG. 5 is a cross-sectional view of the semiconductor package according to the embodiment of the present invention taken along line A-A in FIG. 3. FIG. 6 is a cross-sectional view of the semiconductor package according to the embodiment of the present invention taken along line B-B in FIG. 3. FIG. 7 is an exploded top perspective view of the semiconductor package according to the embodiment of the present invention, and FIG. 8 is an exploded bottom perspective view of the semiconductor package according to the embodiment of the present invention. FIG. 9 is a top perspective view of a semiconductor package according to another embodiment of the present invention. FIG. 10 is a top plan view of the semiconductor package according to the other embodiment of the present invention. In each of these figures, a semiconductor package 1 according to one or more embodiments of the present invention includes a metal board 2, a first frame 3, and a second frame 4. The metal board 2 has a protrusion 22.

As shown in FIG. 1, the metal board 2 according to the embodiment of the present invention includes a mount area 21 on its upper surface, on which a semiconductor device 7 is mountable. The metal board 2 is, for example, rectangular.

The mount area 21 in the embodiment of the present invention refers to an area that can overlap the semiconductor device 7 when the metal board 2 is viewed from above. The metal board 2 has dimensions of, for example, 10×10 mm to 50×50 mm. The metal board 2 has a thickness of, for example, 0.5 to 5 mm.

The metal board 2 is formed from, for example, a metal material. The metal material may be copper. The metal board 2 formed from copper can have a thermal expansion coefficient of $16 \times 10^{-6}$/K. The metal board 2 may be formed from copper, iron, nickel, chromium, cobalt, molybdenum, tungsten, or an alloy of any of these metals. An ingot formed from such a metal material may undergo metal working, such as rolling, punching, pressing, or cutting, to prepare a metal member that serves as the metal board 2.

As shown in FIG. 2, the metal board 2 has the protrusion 22, which protrudes from the bottom surface. The protrusion 22 is, for example, rectangular. The protrusion 22 has, for example, dimensions of 9×9 mm to 49×49 mm as viewed from above, and a thickness of 0.3 mm to 4 mm. The metal board 2 excluding the protrusion 22, or the portion of the metal board 2 located between a first frame 3 and a second frame 4 (described later) has a thickness of 0.2 to 4 mm.

The portion of the metal board 2 between the first frame 3 and the second frame 4 may have a smaller thickness than the first frame 3 and the second frame 4. The portion of the metal board 2 between the first frame 3 and the second frame 4 having a smaller thickness than the first frame 3 and the second frame 4 means less metal used in that portion of the metal board 2. In this structure, less metal undergoes thermal expansion and causes less warpage of the metal board 2.

With the portion of the metal board 2 between the first frame 3 and the second frame 4 having a smaller thickness than the first and second frames 3 and 4, the first and second frames 3 and 4 retain the metal board 2 with a greater force than the metal board 2 pressing the first and second frames 3 and 4 when the metal board 2 expands thermally. With the portion of the metal board 2 between the first frame 3 and the second frame 4 with a greater thickness than the first and second frames 3 and 4, the metal board 2 thermally expands and deforms under a greater force pressing the first and second frames 3 and 4. Unlike this, the metal board 2 in with the structure according to the embodiment of the present invention deforms under a greater force from the first and second frames 3 and 4 retaining the metal board 2.

The semiconductor package 1 can reduce stress on the joints and the surroundings resulting from the difference in thermal expansion coefficient between the metal board 2 and the first and second frames 3 and 4. Thus, the semiconductor package 1 according to the embodiment of the present invention has less cracks or delamination at the joints between the metal board 2 and the first frame 3 or the second frame 4. The semiconductor package 1 has less cracks or breaks (described later) in the first frame 3 or the second frame 4, and thus has less damage.

The first frame 3 surrounds the mount area 21 of the metal board 2. The first frame 3 has rectangular outer and inner edges as viewed from above, and has four side walls. The first frame 3 is joined to the upper surface of the metal board 2 with a bond, such as silver wax, solder, or a resin bond.

As viewed from above, the first frame 3 has an outer edge size of, for example, 10×10 mm to 50×50 mm, and an inner edge size of 5×5 mm to 49×49 mm. The first frame 3 has a thickness, or a width between the outer edge and the inner edge, of, for example, 1 to 5 mm. The first frame 3 has a height of 1 to 10 mm.

The first frame 3 is formed from, for example, a ceramic material. Examples of the ceramic material include sintered aluminum oxide and sintered aluminum nitride. The first frame 3 may also be formed from a resin material, such as an epoxy resin. Like the metal board 2, the first frame 3 may be formed from a metal material. Examples of the metal material include iron, copper, nickel, chromium, cobalt, molybdenum, tungsten, and an alloy of any of these metal materials. In this case, the first frame 3 may be formed from a metal material having a smaller thermal expansion coefficient than the metal board 2 to reduce thermal expansion of the metal board 2 at the upper surface.

In the semiconductor package 1 according to the embodiment of the present invention, as shown in FIGS. 7 and 8, the first frame 3 has inner walls with round corners as viewed from above. The round corners can receive less stress when the metal board 2 expands thermally. As shown in FIGS. 9 and 10, the corners may be square. Such square corners can increase the space defined by the first frame 3.

The metal board 2 has the second frame 4 on its bottom surface. The second frame 4 overlaps the first frame 3 when the semiconductor package 1 is viewed from above. The second frame 4 has rectangular outer and inner edges as viewed from above, and has four side walls. The second frame 4 is joined to the bottom surface of the metal board 2 with a bond, such as silver wax, solder, or a resin bond.

The second frame 4 may have the inner walls in contact with, rather than joined to, the side surfaces of the protrusion 22. In this case, the second frame 4 may be partly in contact with the side surfaces of the protrusion 22, and may be partly slightly spaced apart from the side surfaces of the protrusion 22. With the inner walls of the second frame 4 in contact with the side surfaces of the protrusion 22 instead of being fixed to the side surfaces of the protrusion 22, the bond material and the second frame 4 can have less cracks resulting from the difference in thermal expansion coefficient when the metal board 2 thermally expands and presses the second frame 4 than when the inner walls of the second frame 4 and the side surfaces of the protrusion 22 are joined together. This structure can reduce stress around the inner walls of the second frame 4 resulting from the difference in thermal expansion coefficient between the metal board 2 and the second frame 4. The semiconductor package 1 according to the embodiment of the present invention can reduce cracks or breaks generated in the second frame 4, and thus has less damage.

As viewed from above, the second frame 4 has an outer edge size of, for example, 10×10 mm to 50×50 mm, and an inner edge size of 5×5 mm to 49×49 mm. The second frame 4 has a thickness, or a width between the outer edge and the inner edge of, for example, 1 to 5 mm. The second frame 4 has a height of 0.2 to 3.9 mm.

The second frame 4 may be formed from, for example, a ceramic material. Examples of the ceramic material include sintered aluminum oxide and sintered aluminum nitride. The second frame 4 may also be formed from a resin material, such as an epoxy resin. Like the metal board 2, the second frame 4 may be formed from a metal material. Examples of the metal material include iron, copper, nickel, chromium, cobalt, molybdenum, tungsten, and an alloy of any of these metal materials. In this case, the second frame 4 may be formed from a metal material having a smaller thermal expansion coefficient than the metal board 2 to reduce thermal expansion of the metal board 2 at the bottom surface.

With the inner walls in contact with the side surfaces of the protrusion 22, the second frame 4 can reduce horizontal thermal expansion of the protrusion 22 at the side surfaces. Thus, the semiconductor package 1 according to the embodiment of the present invention can reduce deformation or warpage of the metal board 2 caused by deformation of the protrusion 22, and maintain the flatness of the mount area 21. With the inner walls of the second frame 4 in contact with the side surfaces of the protrusion 22, heat generated in the semiconductor device 7 or other components can be released through the metal board 2 directly to the second frame 4, and the metal board 2 can have improved heat dissipation. This also reduces thermal expansion of the metal board 2.

The second frame 4 may have the inner walls joined to the side surfaces of the protrusion 22 with a bond, such as silver wax, gold-tin solder, or a resin bond. This structure enables the second frame 4 to reduce horizontal thermal expansion of the protrusion 22 at the side surfaces, and releases heat in the metal board 2 through the bond to the second frame 4. Thus, the semiconductor package 1 can have improved heat dissipation through the protrusion 22 and the second frame 4.

The protrusion 22 has a bottom surface below the second frame 4. Thus, the semiconductor package 1 has the protrusion 22 that easily comes into contact with external equipment. When a semiconductor apparatus 10 is mounted on an external mounting board, the protrusion 22 is easily joined to the mounting board. Thus, the semiconductor package 1 can have improved heat dissipation through the metal board 2. In other words, heat generated in the semiconductor device 7 mounted on the mount area 21 is easily released through the protrusion 22 of the metal board 2 to the external mounting board.

The semiconductor package 1 according to the embodiment of the present invention with the above structure can easily release heat generated in the semiconductor device 7 to an external mounting board through the protrusion 22 of the metal board 2. Thus, the semiconductor package 1 according to the embodiment of the present invention can achieve heat dissipation, which is one feature of a semiconductor package.

As shown in FIG. 3, the semiconductor package 1 according to the embodiment of the present invention may satisfy $\alpha \geq \beta$ and $H1 \leq H2$, where $\alpha$ is the thermal expansion coefficient of the first frame 3, $\beta$ is the thermal expansion coefficient of the second frame 4, H1 is the thickness of the first frame 3 orthogonal to the mount area 21, and H2 is the thickness of the second frame 4. The semiconductor package 1 according to the embodiment of the present invention thus has less warpage of the metal board 2 caused by the difference in thermal expansion coefficient between the metal board 2 and the first and second frames 3 and 4.

When the second frame 4 has the inner walls in contact with the side surfaces of the protrusion 22, the second frame 4 restricts warpage or deformation of the metal board 2 caused by the difference in thermal expansion coefficient between the metal board 2 and the first and second frames 3 and 4, thus reducing warpage or deformation of the metal board 2.

The protrusion 22 facing the inner walls of the second frame 4 may have a greater thickness than the portion of the metal board 2 between the first frame 3 and the second frame 4. In this structure, the thinner portion of the metal board 2 located between the first frame 3 and the second frame 4 is less likely to warp or deform. This structure also achieves reliable heat dissipation from the mount area 21 through the protrusion 22 to an external mounting board. With the second frame 4 in contact with and surrounding all around the protrusion 22, the metal board 2 including the protrusion 22 with a greater thickness is less likely to warp or deform.

With the protrusion 22 with a greater thickness, the metal board 2 is less likely to warp and has higher rigidity. This increases the rigidity of the semiconductor package 1. The semiconductor package 1 is less likely to deform under an external force applied when a semiconductor apparatus 10 including the semiconductor package 1 is mounted on an external mounting board. The semiconductor package 1 according to the embodiment of the present invention can reduce damage to the semiconductor device 7 mounted in the semiconductor package 1.

The second frame 4 may have an outer edge nearer the outer edge of the metal board 2 than the outer edge of the first frame 3 as viewed from above. With this structure, the semiconductor package 1 according to the embodiment of the present invention can reduce upward warpage of the metal board 2. This structure reduces the space between the center portion of the bottom surface of the protrusion 22 and the mounting board on which the semiconductor apparatus 10 is mounted. The semiconductor package 1 can also achieve reliable heat dissipation.

The semiconductor package 1 according to the embodiment of the present invention may have the first frame 3 and the second frame 4 formed from the same material. For example, the first frame 3 and the second frame 4 are both formed from sintered aluminum oxide, and have a thermal expansion coefficient of $7 \times 10^{-6}$/K. In other words, when the first frame 3 and the second frame 4 are formed from the same material, the first frame 3 joined to the upper surface of the metal board 2 and the second frame 4 joined to the bottom surface of the metal board 2 excluding the protrusion 22 can have the same thermal expansion coefficient. This equalizes the forces that restrict thermal expansion or contraction of the metal board 2 excluding the protrusion 22 in the vertical and horizontal directions. With no difference in thermal expansion coefficient between the first frame 3 and the second frame 4, the metal board 2 is less likely to warp or deform in the vertical and horizontal directions. Also, restricting the thermal expansion or contraction of the metal board 2 with the first frame 3 and the second frame 4 reduces stress that may be unevenly applied on the joints between the metal board 2 and the first and second frames 3 and 4.

As shown in FIGS. 1 to 5, the first frame 3 may have lead terminals 5 on its upper surface. As shown in FIGS. 5 and 6, the metal board 2 may have an outer edge larger than the outer edge of the first frame 3 as viewed from above.

As shown in FIGS. 1 to 6, the metal board 2 may have an outer edge larger than the outer edge of the first frame 3 as viewed from above. In this case, the lead terminals 5 overlap the metal board 2. The metal board 2 having a larger outer edge than the first frame 3 as viewed from above can narrow the distribution of the electric field. This is because the metal board 2 can narrow the distribution of the electric field in the portions of the lead terminals 5 without connected with the first frame 3 or any external circuit board, or having no grounded conductor around them when high-frequency electric signals are transmitted to the lead terminals 5.

The lead terminals 5 are joined to the upper surface of the first frame 3 with a bond, such as gold-tin solder or a resin bond. The lead terminals 5 are electrically connected to the semiconductor device 7 to be mounted on the mount area 21 with, for example, bonding wires, and electrically connected to, for example, an external mounting board, a circuit board, and a power source. The lead terminals 5 are formed from, for example, an alloy of iron, nickel, and cobalt, or an alloy of iron and nickel. The lead terminals 5 extend outward from the outer edge of the first frame 3.

This structure can reduce unstable distribution of an electric field around the lead terminals 5. Thus, the metal board 2 extending outward from the outer edge of the first frame 3 as viewed from above can improve the frequency characteristics of the semiconductor package 1.

Although the first frame 3 and the second frame 4 are formed from, for example, a ceramic material in the above embodiment, the first frame 3 and the second frame 4 may be formed from a metal with a smaller thermal expansion coefficient than the metal board 2. Examples of such a metal material include a Fe—Ni—Co alloy. In the portion of the metal board 2 between the first frame 3 and the second frame 4, the upper surface of the second frame 4 is joined to the metal board 2 with a bond. When the second frame 4 is formed from a metal material, the bond may flow into a space between the side surfaces of the protrusion 22 and the inner walls of the second frame 4 to join the side surfaces of the protrusion 22 to the inner walls of the second frame 4.

When the protrusion 22 has its side surfaces joined to the inner walls of the second frame 4, the inner walls of the second frame 4 and the side surfaces of the protrusion 22 are partly in contact with each other, and the inner walls of the second frame 4 and the side surfaces of the protrusion 22 are spaced apart in the other areas in the semiconductor package 1. The space is filled with a bond to join the side surfaces of the protrusion 22 to the inner walls of the second frame 4 and to fix the metal board 2 firmly, thus reducing the warpage of the metal board 2.

The first and second frames 3 and 4 formed from a metal material are very rigid. Such first and second frames 3 and 4 are less likely to break or crack when the metal board 2 thermally expands and presses the first and second frames 3 and 4.

Method for Manufacturing Semiconductor Package

The metal board 2 formed from, for example, a metal material may be formed from copper. The metal board 2 has the protrusion 22 formed through metal working into a rectangular shape. In this case, an ingot formed from such a metal material undergoes metal working, such as rolling, punching, pressing, or cutting, to prepare a metal member that serves as the metal board 2.

When the first frame 3 is formed from, for example, a metal material, an iron-nickel-cobalt alloy is used and cut into a frame. The first frame 3, to which the lead terminals 5 are joined and fixed with a bond formed from an insulating material, such as a resin bond or a glass bond, is joined to the upper surface of the metal board 2 with, for example, gold-tin solder or lead-free solder to surround the mount area 21.

When the first frame 3 is formed from, for example, sintered aluminum oxide, an appropriate amount of a sintering aid, such as magnesia, silica, or calcia, is added to an alumina powder. A solvent is added to the alumina powder, and the mixture is thoroughly kneaded and defoamed to prepare slurry. Using the slurry, a rolled ceramic green sheet is formed with, for example, a doctor blade method, and cut into an appropriate size. Signal lines such as wiring patterns, to which the respective lead terminal 5 are to be connected and fixed, are screen-printed on the ceramic green sheet prepared by the cutting. The ceramic green sheet is then fired in a reducing atmosphere at about 1600° C. Multiple ceramic green sheets may be stacked on one another before the firing process. The resulting first frame 3, which has the lead terminals 5 joined to its upper surface with silver-copper solder, is joined to the upper surface of the metal board 2 with, for example, gold-tin solder to surround the mount area 21.

The second frame 4 is prepared in the same manner as the first frame 3. The second frame 4 is joined to the bottom surface of the metal board 2. The second frame 4 is joined to the bottom surface of the metal board 2 excluding the protrusion 22 with a bond, such as gold-tin solder.

The semiconductor package 1 according to the embodiments of the present invention can be manufactured in the manner described above. The manufacturing steps are not limited to the order described above.

Structure of Semiconductor Apparatus

Figure 11:
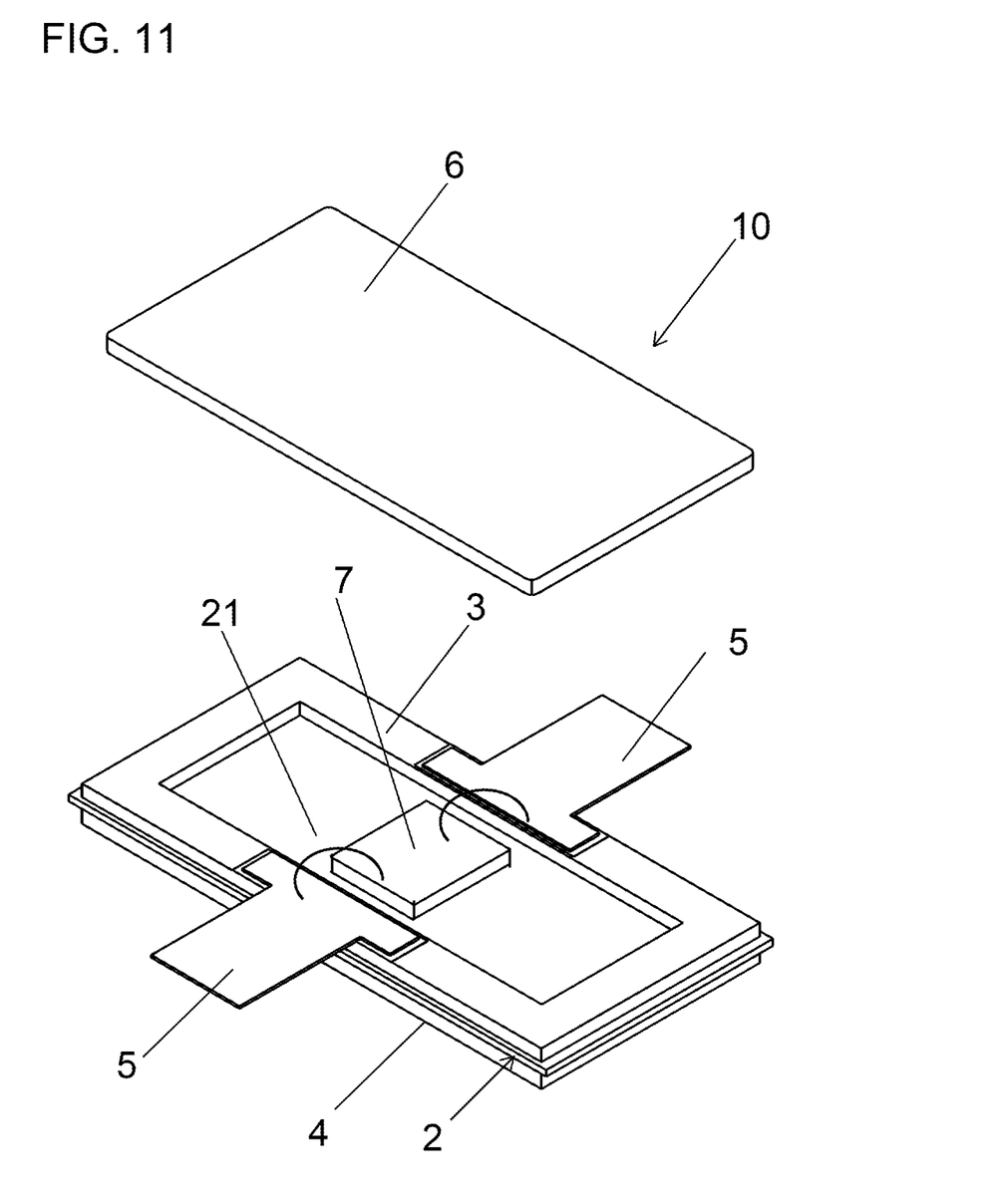
FIG. 11 is a top perspective view of a semiconductor apparatus according to an embodiment of the present invention.

The semiconductor apparatus 10 according to an embodiment of the present invention will now be described in detail with reference to the drawings. FIG. 11 is a top perspective view of the semiconductor apparatus 10 according to the embodiment of the present invention. As shown in FIG. 11, the semiconductor apparatus 10 according to the embodiment of the present invention includes the semiconductor package 1 according to the embodiment described above, the semiconductor device 7 mounted on the mount area 21 of the semiconductor package 1, and a lid 6 that seals the semiconductor device 7 joined to the first frame 3.

The semiconductor apparatus 10 according to the embodiment of the present invention includes the semiconductor device 7 mounted on the mount area 21 of the metal board 2. The semiconductor device 7 is electrically connected to the lead terminals 5 with bonding wires. Electric signals are input and output to and from the semiconductor device 7 through the lead terminals 5 and the bonding wires, allowing intended input and output to and from the semiconductor device 7.

The lid 6 to seal the semiconductor device 7 is joined to the first frame 3. Examples of the semiconductor device 7 include an integrated circuit (IC), a large-scale integration (LSI) circuit, and a semiconductor device for a power device. The lid 6 is joined to the upper surface of the first frame 3, and seals the semiconductor device 7 in the space surrounded by the metal board 2, the first frame 3, and the lid 6. The semiconductor device 7 is sealed to reduce deterioration in the semiconductor package 1 used over a long time.

The lid 6 is formed from, for example, a metal material, such as iron, copper, nickel, chromium, cobalt, and tungsten, or an alloy of any of these metals. The first frame 3 and the lid 6 can be joined together by, for example, seam welding. The first frame 3 and the lid 6 may be joined together with, for example, gold-tin solder.

Although the semiconductor package 1 and the semiconductor apparatus 10 including the semiconductor package 1 according to each of the above embodiments are described above, the present invention is not limited to these embodiments. The embodiments may be modified variously without departing from the spirit and scope of the invention.

REFERENCE SIGNS LIST

1 semiconductor package
2 metal board
21 mount area
22 protrusion
3 first frame
4 second frame
5 lead terminal
6 lid
7 semiconductor device
10 semiconductor apparatus

The invention claimed is:

1. A semiconductor package, comprising:
a metal board having an upper surface with a mount area on which a semiconductor device is mountable;
a first frame located on the upper surface of the metal board to surround the mount area; and
a second frame located on a bottom surface of the metal board to overlap the first frame,
wherein the metal board includes a protrusion protruding from the bottom surface, the protrusion has side surfaces facing inner walls of the second frame, the protrusion has a bottom surface located below the second frame, and the side surfaces of the protrusion are partly spaced apart from the inner walls of the second frame.

2. The semiconductor package according to claim 1, wherein the protrusion of the second frame has a greater thickness than a portion of the metal board located between the first frame and the second frame.

3. The semiconductor package according to claim 1, wherein the first frame and the second frame are formed from the same material.

4. The semiconductor package according to claim 1, wherein the first frame and the second frame are formed from different materials.

5. The semiconductor package according to claim 1, wherein the first frame has an upper surface on which lead terminals are located, and the metal board has an outer edge larger than an outer edge of the first frame and an outer edge of the second frame as viewed from above.

6. A semiconductor apparatus, comprising:

the semiconductor package according to claim 1;

a semiconductor device mounted on the mount area of the semiconductor package; and a lid located on the upper surface of the first frame and covering the semiconductor device.

7. A semiconductor package, comprising:

a metal board having an upper surface with a mount area on which a semiconductor device is mountable;

a first frame located on the upper surface of the metal board to surround the mount area; and a second frame located on a bottom surface of the metal board to overlap the first frame, wherein the metal board includes a protrusion protruding from the bottom surface, the protrusion has side surfaces facing inner walls of the second frame, the protrusion has a bottom surface located below the second frame, and the protrusion has a greater thickness than a portion of the metal board located between the first frame and the second frame.

8. The semiconductor package according to claim 7, wherein the protrusion has side surfaces partly spaced apart from the inner walls of the second frame.

9. The semiconductor package according to claim 8, wherein the side surfaces of the protrusion and the inner walls of the second frame are joined together with a bond.

* * * * *